United States Patent
Yamamoto et al.

(10) Patent No.: US 10,199,562 B2
(45) Date of Patent: Feb. 5, 2019

(54) ELECTRONIC DEVICE AND METHOD OF FABRICATING THE SAME

(71) Applicant: TAIYO YUDEN CO., LTD., Tokyo (JP)

(72) Inventors: Shinji Yamamoto, Tokyo (JP); Jumpei Konno, Tokyo (JP); Takashi Miyagawa, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/646,399

(22) Filed: Jul. 11, 2017

(65) Prior Publication Data

US 2018/0033952 A1    Feb. 1, 2018

(30) Foreign Application Priority Data

Jul. 28, 2016 (JP) .................................. 2016-148909

(51) Int. Cl.
*H01L 41/23* (2013.01)
*H01L 41/053* (2006.01)
(Continued)

(52) U.S. Cl.
CPC .......... *H01L 41/23* (2013.01); *H01L 41/0475* (2013.01); *H01L 41/0533* (2013.01); *H01L 41/29* (2013.01); *H01L 41/312* (2013.01); *H03H 3/02* (2013.01); *H03H 3/08* (2013.01); *H03H 9/059* (2013.01); *H03H 9/0523* (2013.01); *H03H 9/25* (2013.01);
(Continued)

(58) Field of Classification Search
CPC . H01L 41/0475; H01L 41/0533; H01L 41/23; H01L 41/29; H01L 41/312; H01L 41/1873; H03H 3/08; H03H 9/25; H03H 9/14541
See application file for complete search history.

(56) References Cited

U.S. PATENT DOCUMENTS 6,853,067 B1 * 2/2005 Cohn .................. B81C 1/00238
257/704
7,820,468 B2 * 10/2010 Lee ........................ H01L 24/97
438/51
(Continued)

FOREIGN PATENT DOCUMENTS

JP     2003-273692 A     9/2003
JP     2004-96456 A     3/2004
(Continued)

OTHER PUBLICATIONS

English Machine Translation of JP 2010-245739, Matsumoto et al., published Oct. 28, 2010.*
(Continued)

*Primary Examiner* — Peniel M Gumedzoe
(74) *Attorney, Agent, or Firm* — Chen Yoshimura LLP

(57) ABSTRACT

A method of fabricating an electronic device, the method including: arranging a device chip with no bump located on a lower surface of the device chip on a mounting substrate including a bump located on an upper surface of the mounting substrate; and bonding a pad located on the lower surface of the device chip and the bump by applying an ultrasonic wave to the device chip from an upper surface of the device chip.

9 Claims, 14 Drawing Sheets

(51) Int. Cl.
*H03H 9/25* (2006.01)
*H01L 41/312* (2013.01)
*H03H 3/08* (2006.01)
*H01L 41/047* (2006.01)
*H01L 41/29* (2013.01)
*H03H 3/02* (2006.01)
*H03H 9/05* (2006.01)
*H01L 41/187* (2006.01)
*H03H 9/145* (2006.01)

(52) U.S. Cl.
CPC . *H01L 41/1873* (2013.01); *H01L 2224/81192* (2013.01); *H01L 2224/97* (2013.01); *H03H 9/14541* (2013.01)

(56) References Cited

U.S. PATENT DOCUMENTS

| | | | | |
|---|---|---|---|---|
| 8,035,176 B2* | 10/2011 | Jung | ................... | B81C 1/0023 257/415 |
| 2003/0214029 A1* | 11/2003 | Tao | ................... | H01L 23/10 257/723 |
| 2004/0113215 A1* | 6/2004 | Shimada | ................... | G01H 3/12 257/414 |
| 2005/0064627 A1 | 3/2005 | Kimura et al. | | |
| 2005/0110161 A1* | 5/2005 | Naito | ................... | H01L 24/81 257/778 |
| 2006/0138672 A1 | 6/2006 | Sakinada et al. | | |
| 2007/0040281 A1* | 2/2007 | Nakayama | ................... | B81B 7/0041 257/778 |
| 2015/0217998 A1* | 8/2015 | Magnus | ................... | B81C 1/00896 257/419 |

FOREIGN PATENT DOCUMENTS

| | | |
|---|---|---|
| JP | 2004-207674 A | 7/2004 |
| JP | 2005-093839 A | 4/2005 |
| JP | 2006-203149 A | 8/2006 |
| JP | 2010-245739 A | 10/2010 |
| JP | 2013-225749 A | 10/2013 |
| JP | 2015-126014 A | 7/2015 |

OTHER PUBLICATIONS

Japanese Office Action dated Nov. 27, 2018, in a counterpart Japanese patent application No. 2016-148909. (A machine translation (not reviewed for accuracy) attached.).

* cited by examiner

ELECTRONIC DEVICE AND METHOD OF FABRICATING THE SAME

CROSS-REFERENCE TO RELATED APPLICATION

This application is based upon and claims the benefit of priority of the prior Japanese Patent Application No. 2016-148909, filed on Jul. 28, 2016, the entire contents of which are incorporated herein by reference.

FIELD

A certain aspect of the present invention relates to an electronic device and a method of fabricating the same.

BACKGROUND

Flip-chip mounting has been known as a method for mounting a device chip including a functional element such as, for example, an acoustic wave element on a mounting substrate as disclosed in, for example, Japanese Patent Application Publication Nos. 2004-96456, 2004-207674, 2006-203149, and 2010-245739.

To reduce the chip area of the device chip, the size of the pad on which a bump is bonded is demanded to be reduced. However, the reduction of the pad size decreases the bond strength between the bump and the pad.

SUMMARY OF THE INVENTION

According to a first aspect of the present invention, there is provided a method of fabricating an electronic device, the method including: arranging a device chip with no bump located on a lower surface of the device chip on a mounting substrate including a bump located on an upper surface of the mounting substrate; and bonding a pad located on the lower surface of the device chip and the bump by applying an ultrasonic wave to the device chip from an upper surface of the device chip.

According to a second aspect of the present invention, there is provided a method of fabricating an electronic device, the method including: forming a functional element on an upper surface of a substrate; forming a metal layer on the upper surface of the substrate so that the metal layer surrounds the functional element; forming a burr on an upper surface of the metal layer and cutting the substrate into a plurality of device chips by dicing the metal layer and the substrate with use of a dicing blade; and causing a tool to hold at least one of the plurality of device chips by causing the tool to be in contact with an upper surface of the burr without being in contact with an upper surface of the functional element.

According to a third aspect of the present invention, there is provided an electronic device including: a mounting substrate; a device chip including a functional element and a pad on a lower surface of the device chip, the functional element facing an upper surface of the mounting substrate across an air gap; and a single bump bonding the mounting substrate and the pad, an area of a bond between the single bump and the pad being less than an area of a bond between the single bump and the mounting substrate.

DETAILED DESCRIPTION

Hereinafter, a description will be given of embodiments with reference to the accompanying drawings.

First Embodiment

Figure 1A:
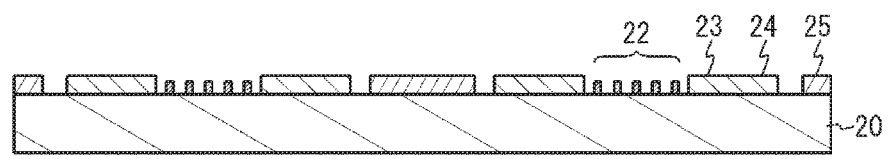
FIG. 1A and FIG. 1B are cross-sectional views illustrating a method of fabricating an electronic device in accordance with a first embodiment.
Figure 1B:
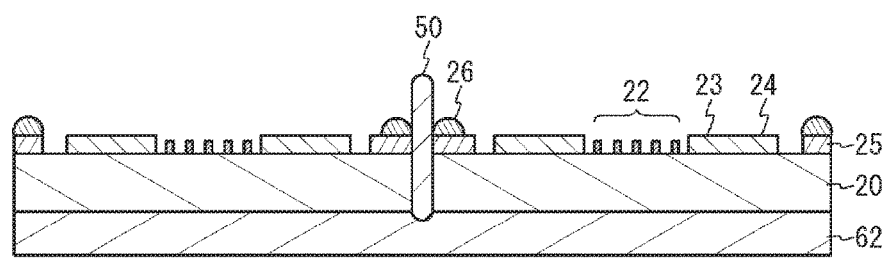

FIG. 1A and FIG. 1B are cross-sectional views illustrating a method of fabricating an electronic device in accordance with a first embodiment. As illustrated in FIG. 1A, functional elements 22, wiring lines 23, pads 24, and a metal layer 25 are formed on a substrate 20. The functional element 22 is, for example, a surface acoustic wave element or an acoustic wave element such as a piezoelectric thin film resonator. The wiring lines 23 electrically connect between the functional elements 22 and/or between the functional element 22 and the pad 24. The metal layer 25 is located so as to surround each of the functional elements 22. The wiring lines 23 and the pads 24 are formed of, for example, a metal layer such as a gold layer, an aluminum layer, or a copper layer. The metal layer 25 is, for example, a gold layer, an aluminum layer, a copper layer, or a nickel layer. The wiring lines 23 and the pads 24 may be formed at the same time as or separately from the metal layer 25.

Figure 2A:
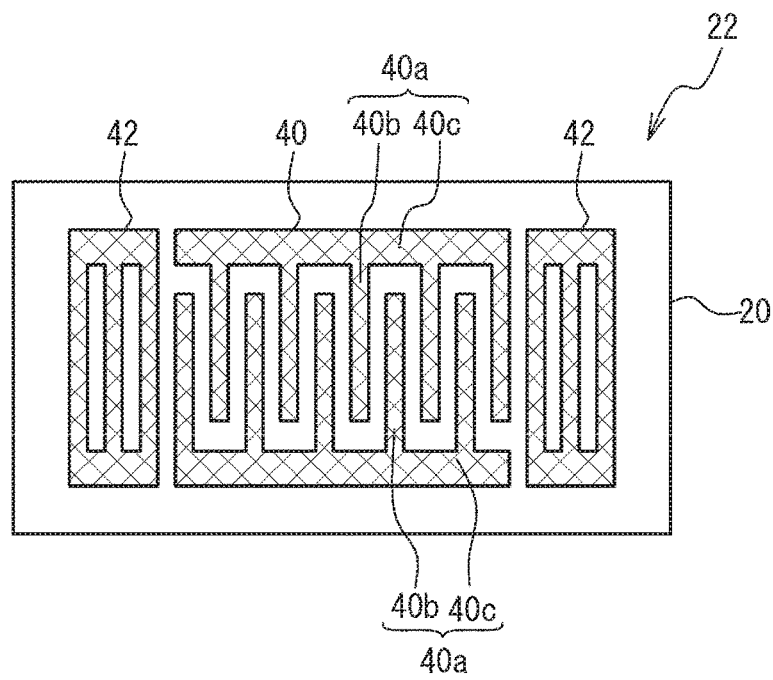
FIG. 2A and FIG. 2B are a plan view and a cross-sectional view of exemplary functional elements, respectively.
Figure 2B:
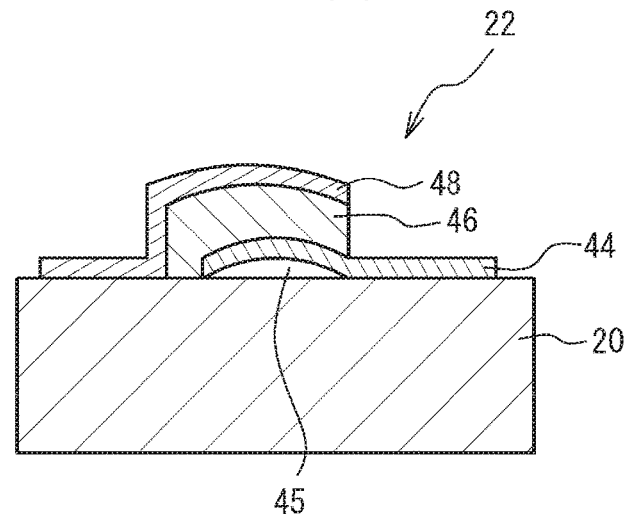

FIG. 2A and FIG. 2B are a plan view and a cross-sectional view of examples of the functional element, respectively. FIG. 2A illustrates an exemplary surface acoustic wave element as the functional element 22. The substrate 20 is a piezoelectric substrate such as, for example, a lithium tantalate substrate or a lithium niobate substrate. The substrate 20 may be a substrate formed of a piezoelectric substrate such as a lithium tantalate substrate or a lithium niobate substrate bonded on the upper surface of a support substrate such as a sapphire substrate, a spinel substrate, an alumina substrate, or a silicon substrate. An interdigital transducer (IDT) 40 and reflectors 42 are formed on the substrate 20. The IDT 40 includes a pair of comb-shaped electrodes 40a facing each other. The comb-shaped electrode 40a includes a plurality of electrode fingers 40b and a bus bar 40c to which the electrode fingers 40b are connected. The reflectors 42 are located at both sides of the IDT 40. The IDT 40 excites a surface acoustic wave on the substrate 10. The IDT 40 and the reflectors 42 are formed of a metal layer such as an aluminum layer or a copper layer. A protective film or a temperature compensation film made of an insulating material may be located on the IDT 40 and the reflectors 42.

FIG. 2B illustrates an exemplary piezoelectric thin film resonator as the functional element 22. A piezoelectric film 46 is located on the substrate 20. The substrate 20 is, for example, an insulative substrate such as a sapphire substrate, a spinel substrate, or an alumina substrate, or a semiconductor substrate such as a silicon substrate. A lower electrode 44 and an upper electrode 48 are located so as to sandwich the piezoelectric film 46. An air gap 45 is formed between the lower electrode 44 and the substrate 20. The lower electrode 44 and the upper electrode 48 excite the acoustic wave in the thickness extension mode in the piezoelectric film 46. The lower electrode 44 and the upper electrode 48 are formed of a metal film such as, for example, a ruthenium film. The piezoelectric film 46 is, for example, an aluminum nitride film.

As illustrated in FIG. 1B, the lower surface of the substrate 20 is attached to a dicing tape 62. The metal layer 25 and the substrate 20 is cut with use of a dicing blade 50. This process separates the substrate 20 into individual device chips 21 each including the functional element 22. In this process, since the metal layer 25 has ductility, burrs 26 are formed along the cut surface.

Figure 3A:
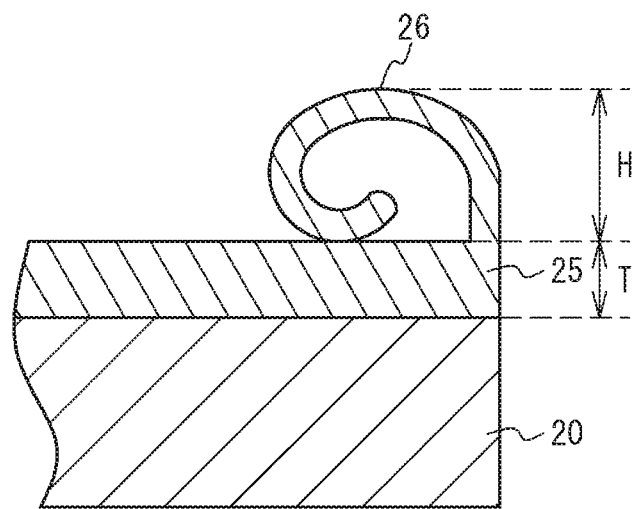
FIG. 3A is a cross-sectional view of a burr.
Figure 3B:
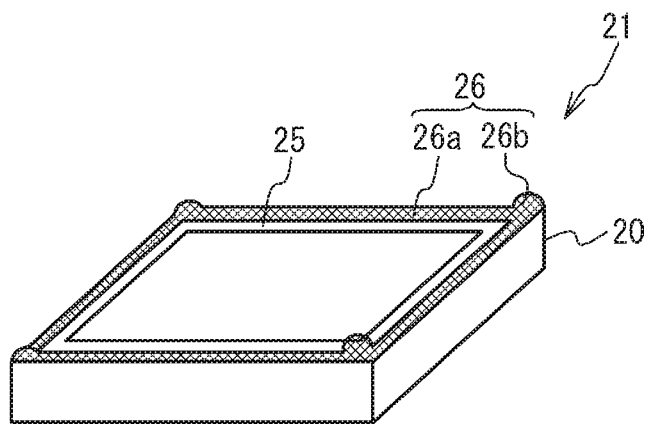
FIG. 3B is a perspective view of a chip.

FIG. 3A is a cross-sectional view of a burr, and FIG. 3B is a perspective view of a chip. As illustrated in FIG. 3A, the burr 26 curls and protrudes from the metal layer 25. The height H of the burr 26 is approximately two to three times greater than the thickness T of the metal layer 25. As illustrated in FIG. 3B, since the metal layer 25 is located around the device chip 21, the burrs 26 are formed around the device chip 21. Burrs 26b formed at the corners of the device chip 21 may be higher than burrs 26a formed in the sides of the device chip 21.

Figure 4A:
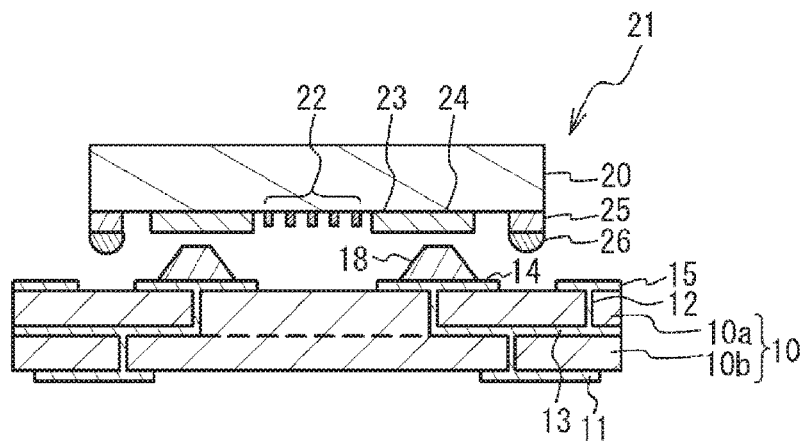
FIG. 4A and FIG. 4B are cross-sectional views illustrating a method of fabricating the electronic device in accordance with the first embodiment (No. 1)

FIG. 4A through FIG. 6B are cross-sectional views illustrating the method of fabricating the electronic device of the first embodiment. As illustrated in FIG. 4A, a substrate 10 includes insulating layers 10a and 10b. Terminals 11 are located on the lower surface of the substrate 10. Internal wiring lines 13 are located between the insulating layers 10a and 10b. Via wirings 12 are located so as to penetrate through the insulating layers 10a and 10b. Pads 14 and a ring-shaped electrode 15 are located on the upper surface of the substrate 10. The ring-shaped electrode 15 is located in the periphery of the substrate 10. The via wiring 12 and the internal wiring line 13 electrically connect the terminal 11 and the pad 14. The terminals 11, the via wirings 12, the internal wiring lines 13, the pads 14, and the ring-shaped electrode 15 are formed of a metal layer such as, for example, a copper layer, a gold layer, an aluminum layer, or a nickel layer. A bump 18 is located on the pad 14. The bump 18 is, for example, a gold stud bump. The bump 18 may be a copper bump. Alternatively, the bump 18 may be a plating bump. A device chip 21 is arranged above the substrate 10 so that the pads 24 of the device chip 21 are positioned above the bumps 18.

Figure 4B:
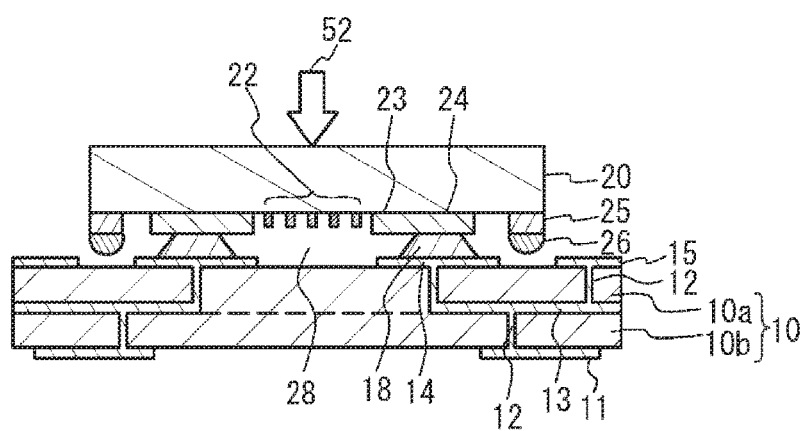

As illustrated in FIG. 4B, as indicated by an arrow 52, ultrasonic waves are applied to the device chip 21 from the upper surface of the device chip 21 and the device chip 21 is pressed. This process bonds the bumps 18 to the pads 14 and 24.

Figure 5A:
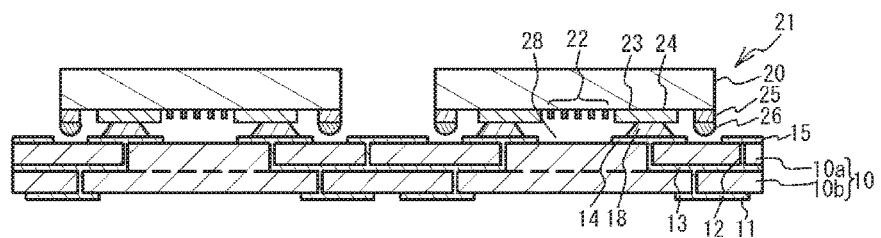
FIG. 5A through FIG. 5C are cross-sectional views illustrating the method of fabricating the electronic device of the first embodiment in accordance with the first embodiment (No. 2)
Figure 5B:
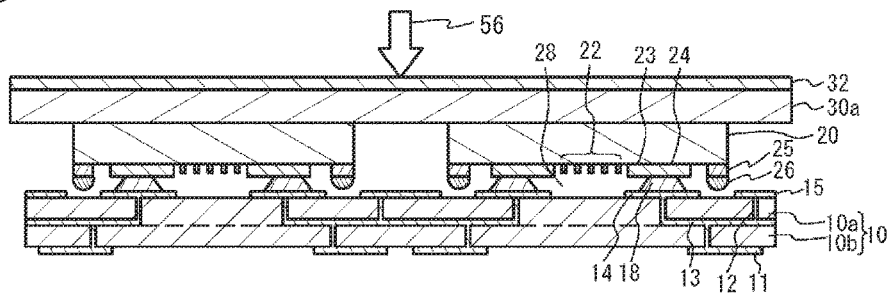
Figure 5C:
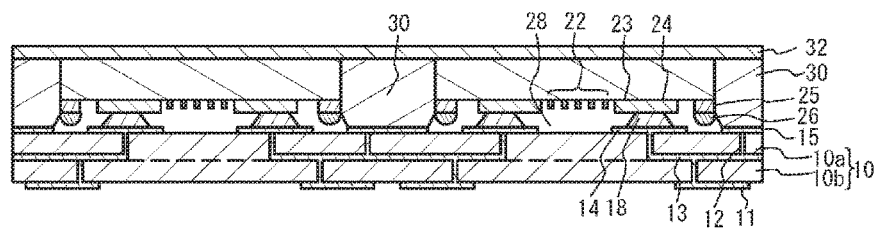

As illustrated in FIG. 5A, a plurality of the device chips 21 are flip-chip mounted on the substrate 10. As illustrated in FIG. 5B, a plate 30a made of solder such as AgSu or resin is arranged on the device chip 21. A lid 32 is arranged on the plate 30a. As indicated by an arrow 56, the lid 32 is pressed against the device chips 21 at a temperature equal to or greater than the melting point of the plate 30a. The lid 32 is a flat plate, and is an insulative plate or a metal plate. As illustrated in FIG. 5C, this process allows a sealing material 30 made from the melted plate 30a to be located so as to surround each of the device chips 21. Since the wettability between the sealing material 30 and the ring-shaped electrode 15 is good, the sealing material 30 is bonded with the ring-shaped electrode 15. When the burr 26 has a poor wettability with the sealing material 30, the burr 26 inhibits the sealing material 30 from penetrating into an air gap 28 under the device chip 21.

Figure 6A:
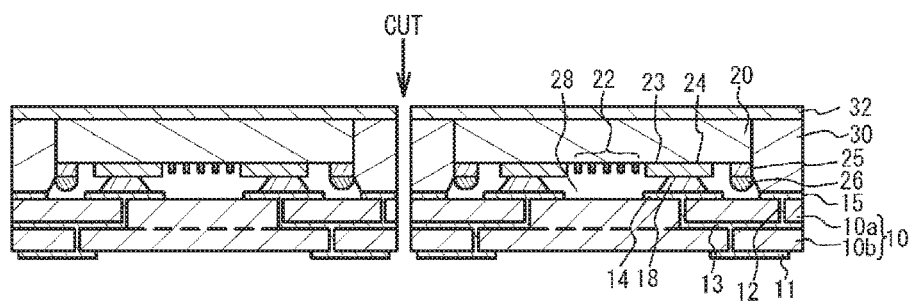
FIG. 6A and FIG. 6B are cross-sectional views illustrating the method of fabricating the electronic device in accordance with the first embodiment (No. 3)
Figure 6B:
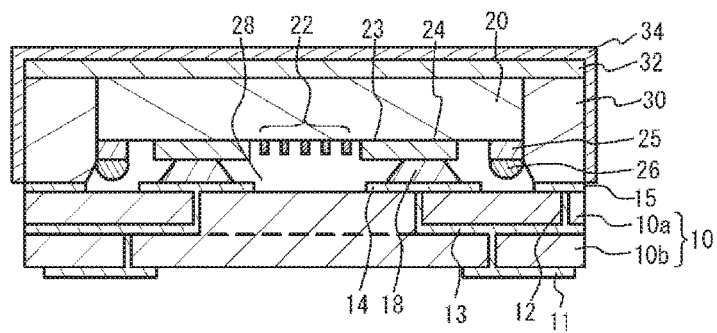

As illustrated in FIG. 6A, the lid 32, the sealing material 30, and the substrate 10 are cut. A dicing method using a dicing blade is used for cutting, for example. As illustrated in FIG. 6B, a protective film 34 is formed so as to cover the sealing material 30 and the lid 32. The protective film 34 is a metal film or an insulating film, and is formed by, for example, barrel electrolytic plating.

Figure 7A:
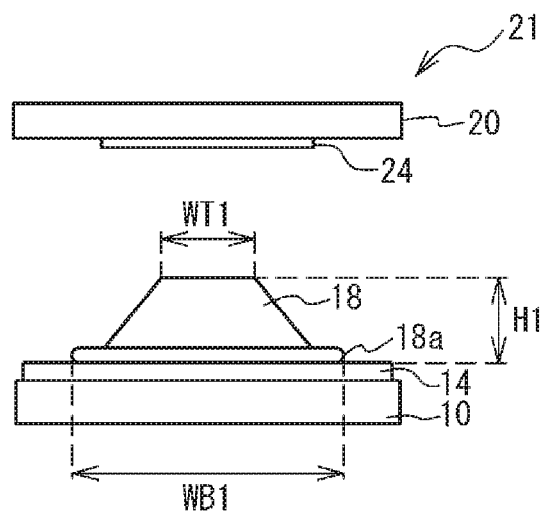
FIG. 7A through FIG. 7C are side views illustrating a bonding method in accordance with the first embodiment.
Figure 7B:
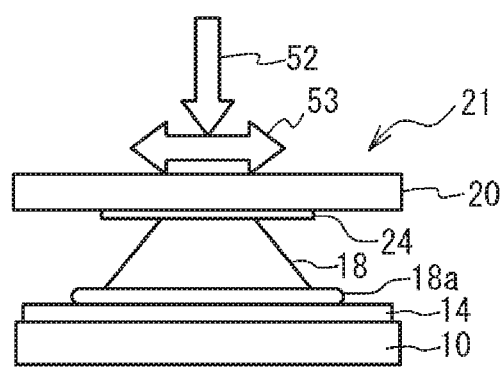
Figure 7C:
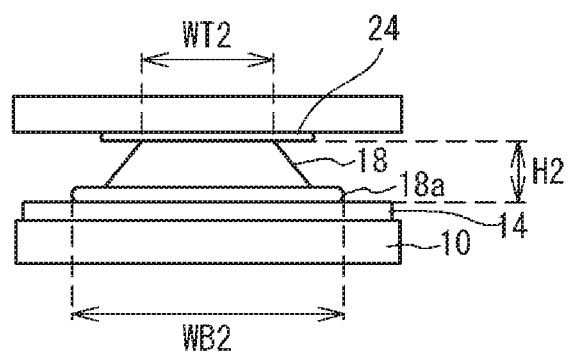

The bonding state between the pad 24 and the bump 18 was examined. FIG. 7A through FIG. 7C are side views illustrating a bonding method in accordance with the first embodiment. As illustrated in FIG. 7A, the pad 14 is located on the upper surface of the substrate 10. The substrate 10 is made of, for example, resin. The pad 14 is an Au pad. An Au stud bump is formed on the pad 14 as the bump 18. The lower surface of the bump 18 has a diameter WB1 of approximately 80 µm, and the upper surface of the bump 18 has a diameter WT1 of approximately 25 µm. The bump 18 has a height H1 of approximately 28 µm. The bump 18 includes a base 18a. The device chip 21 is arranged above the substrate 20. The pad 24 is located on the lower surface of the substrate 20. The pad 24 is an Au pad, and has dimensions of 60 µm×60 µm.

As illustrated in FIG. 7B, the lower surface of the pad 24 is made to be in contact with the upper surface of the bump 18. The substrate 10 is heated. As indicated by the arrow 52, the device chip 21 is pressed against the substrate 10. Furthermore, ultrasonic waves are applied to the device chip 21 from the upper surface. This process vibrates the device chip 21 in, for example, the planar direction as indicated by an arrow 53.

As illustrated in FIG. 7C, the bump 18 is bonded with the pads 14 and 24. The lower surface of the bump 18 has a diameter WB2 of approximately 80 µm, and the upper surface of the bump 18 has a diameter WT2 of approximately 60 µm. The bump 18 has a height H2 of 15 µm.

Figure 8A:
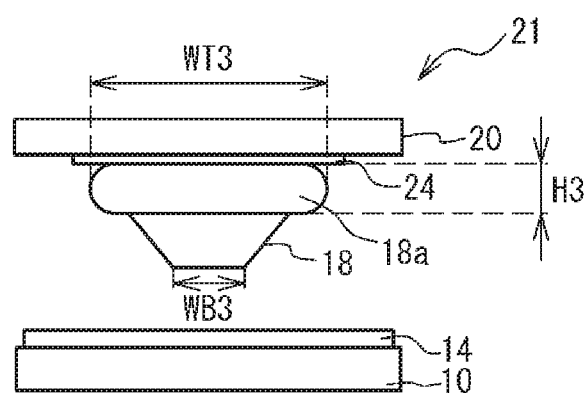
FIG. 8A through FIG. 8C are side views illustrating a bonding method in accordance with a first comparative example.
Figure 8B:
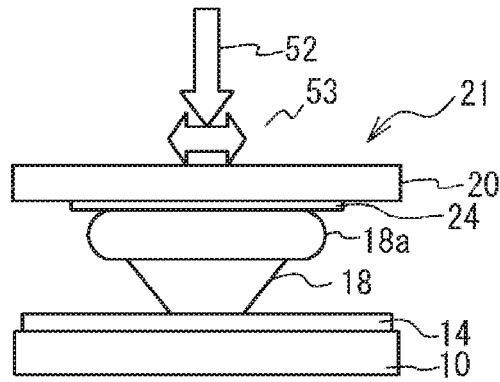
Figure 8C:
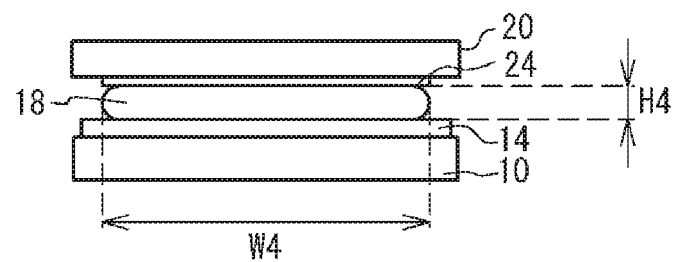

FIG. 8A through FIG. 8C are side views illustrating a bonding method in accordance with a first comparative example. As illustrated in FIG. 8A, the bump 18 is located on the lower surface of the pad 24. The bump 18 is an Au stud bump. The lower surface of the bump 18 has a diameter WB3 of approximately 25 µm, and the upper surface of the bump 18 has a diameter WT3 of approximately 60 µm. The base 18a of the bump 18 has a height H3 of approximately 16 μm. The pad 24 has dimensions of 75 μm×75 μm. Other structures are the same as those of the first embodiment.

As illustrated in FIG. 8B, the lower surface of the bump 18 is made to be in contact with the upper surface of the pad 14. As in FIG. 7B, the substrate 10 is heated, and the device chip 21 is pressed against the substrate 10 as indicated by the arrow 52. Additionally, ultrasonic waves are applied to the device chip 21. This process vibrates the device chip 21 in, for example, the planar direction as indicated by the arrow 53. However, the vibration indicated by the arrow 53 is smaller than that in FIG. 7B because of the weight of the bump 18.

As illustrated in FIG. 8C, the bump 18 is bonded with the pads 14 and 24. The bump 18 has a diameter W4 of approximately 90 μm. The bump 18 has a height H4 of 10 μm.

Table 1 lists the temperature of the substrate 10, pressing load per bump, ultrasonic power, and processing time as the bonding conditions of the first embodiment and the first comparative example. The ultrasonic power is an arbitrary unit. The shapes and the bonding conditions of the first embodiment and the first comparative example are the conditions after optimization.

TABLE 1

| Condition | First embodiment | First comparative example |
|---|---|---|
| Temperature of substrate 10 | 250° C. | 250° C. |
| Load | 30 g/bump | 90 g/bump |
| Ultrasonic power | 50~250 | 60~400 |
| Processing time | 0.2 second | 0.25 second |

Figure 9A:
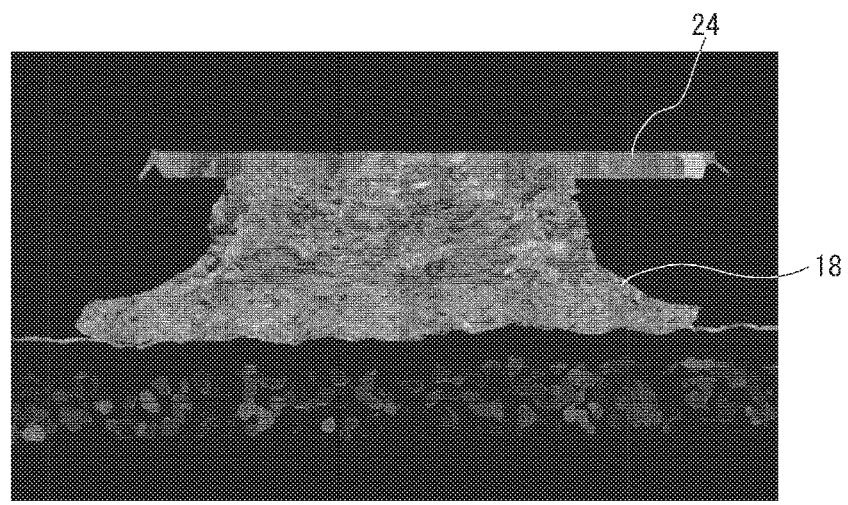
FIG. 9A and FIG. 9B are SEM images of cross-sections of the first embodiment and the first comparative example, respectively.
Figure 9B:

FIG. 9A and FIG. 9B are scanning electron microscope (SEM) images of cross-sections of the first embodiment and the first comparative example, respectively. As illustrated in FIG. 9A and FIG. 9B, the bump 18 of the first comparative example is crushed compared to that of the first embodiment. In the first comparative example, the pad 24 is embedded in the bump 18.

Figure 10A:
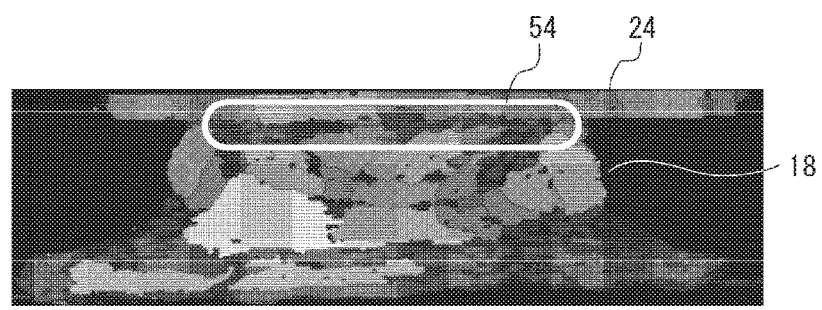
FIG. 10A and FIG. 10B are EBSD images of the first embodiment and the first comparative example, respectively.
Figure 10B:
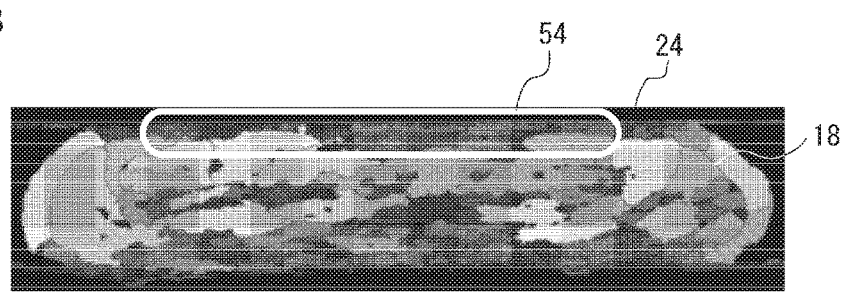

FIG. 10A and FIG. 10B are electron back scattering diffraction (EBSD) images of the first embodiment and the first comparative example. In FIG. 10A and FIG. 10B, the structures in the bump 18 and the pad 24 represent crystal grains of Au. That is, a region with the same brightness represents one crystal grain. As presented by an area 54 in FIG. 10A, in the first embodiment, one large crystal grain exists in the boundary face between the pad 24 and the bump 18. This indicates that the pad 24 and the bump 18 are firmly bonded together. As presented by the area 54 in FIG. 10B, in the first comparative example, many crystal grains exist in the boundary face between the pad 24 and the bump 18. This indicates that the bond between the pad 24 and the bump 18 is weak.

In the first comparative example, ultrasonic waves are applied while the heavy bump 18 is located on the device chip 21. Thus, as illustrated in FIG. 8B, ultrasonic waves are not efficiently applied to the lower surface of the bump 18. In contrast, in the first embodiment, as illustrated in FIG. 7B, the bump 18 is not located on the device chip 21. Thus, ultrasonic waves are efficiently applied to the boundary face between the pad 24 and the bump 18. This is considered to be the reason why the bond between the pad 24 and the bump 18 is strong in the first embodiment compared to that in the first comparative example even though the load and the ultrasonic power at the time of bonding are less than those of the first comparative example and the processing time is less than that of the first comparative example.

Figure 11A:
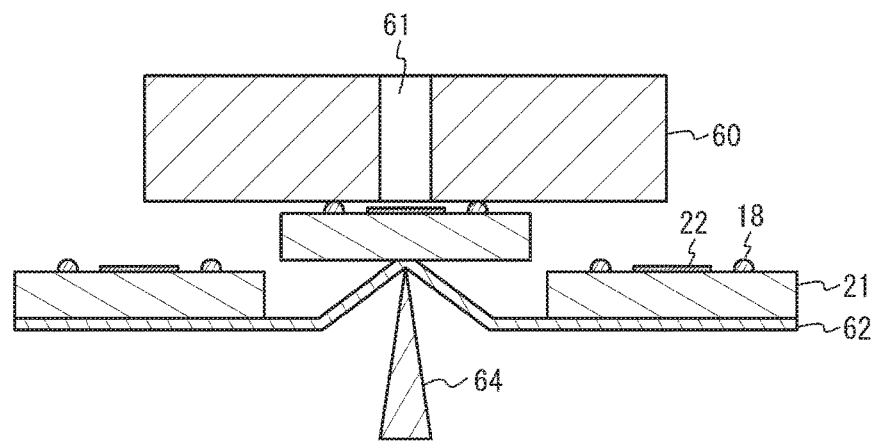
FIG. 11A and FIG. 11B are cross-sectional views illustrating the fabrication methods in accordance with the first comparative example and the first embodiment, respectively.
Figure 11B:
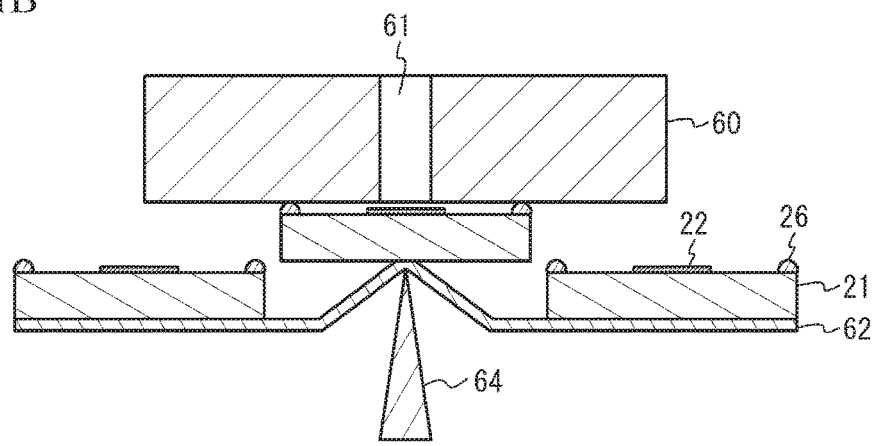

The effect of the burr 26 will be described. FIG. 11A and FIG. 11B are cross-sectional views illustrating the fabrication methods of the first comparative example and the first embodiment, respectively. The device chips 21 are turned upside down between the process of separating the substrate 20 into individual chips in FIG. 1B and the process of arranging the device chips 21 on the substrate 10 in FIG. 4A. As illustrated in FIG. 11A and FIG. 11B, after the dicing in FIG. 1B, the opposite surface of the device chip 21 from the functional element 22 is attached to the dicing tape 62. The device chip 21 is raised from under the dicing tape 62 by a pin 64. A collet 60 has a suction hole 61. By setting the pressure inside the suction hole 61 negative, the suction face of the collet 60 suctions the surface on which the functional element 22 is located of the device chip 21. Thereafter, the opposite surface of the functional element 22 from the functional element 22 is suctioned again by the collet to invert the top and the bottom of the device chip 21.

As illustrated in FIG. 11A, in the first comparative example, the suction face of the collet 60 is in contact with the bump 18. Thus, the suction face is inhibited from being in contact with the functional element 22. As illustrated in FIG. 11B, in the first embodiment, the suction face of the collet 60 is in contact with the burrs 26. Thus, the suction face is inhibited from being in contact with the functional element 22. As described above, in the first embodiment, the bump 18 is not located on the device chip 21, but the burr 26 inhibits the suction face of the collet 60 from being in contact with the functional element 22. Therefore, the functional element 22 is inhibited from being damaged.

In addition, in FIG. 5C, the burr 26 inhibits the sealing material 30 from penetrating between the substrate 10 and the device chip 21. When the sealing material 30 is solder, the burr 26 is preferably made of nickel having a poor solder wettability.

In the first embodiment, as illustrated in FIG. 4A, the bumps 18 are located on the pads 14 located on the upper surface of the substrate 10. The device chip 21 having no bump 18 formed on the lower surface thereof is arranged on the substrate 10 (a mounting substrate). As illustrated in FIG. 4B, ultrasonic waves are applied to the device chip 21 from the upper surface of the device chip 21 to bond the pad 24 (a second pad) located on the lower surface of the device chip 21 with the bump 18. This configuration increases the bond strength between the pad 24 and the bump 18 and makes the area of the bond between the pad 24 and the bump 18 small as illustrated in FIG. 9A and FIG. 10A.

The surface closer to the bump 18 of the pad 24 is preferably made of the same material as the bump 18. This configuration joins the pad 24 and the bump 18 together as illustrated in FIG. 10A, enhancing the bond strength. The lowermost layer of the pad 24 is preferably an Au layer, and the bump 18 is preferably an Au bump. This configuration forms a crystal grain straddling the boundary between the pad 24 and the bump 18. Thus, the bond strength between the pad 24 and the bump 18 is enhanced. The pad 24 may be a Cu layer, and the bump 18 may be a Cu bump.

Furthermore, the bump 18 is a single bump (that is, only one bump is located between the pads 14 and 24). The area of the bond between the bump 18 and the pad 14 is greater than the area of the bond between the bump 18 and the pad 24. This structure reduces the area of the bump 18 in the device chip 21. Thus, the chip size of the device chip 21 is reduced. The diameter (width) WT2 of the upper surface of the bump 18 is preferably 100 μm or less after bonding, more preferably 80 μm or less, further preferably 60 μm or less. The height H2 of the bump 18 is preferably from 5 μm to 20 μm.

The device chip 21 includes the functional element 22 and the burr 26 that surrounds the functional element 22 and has a greater thickness than the functional element 22 on the lower surface thereof. That is, the height from the surface of the device chip 21 to the upper surface of the burr 26 is greater than the height from the surface of the device chip 21 to the surface of the functional element 22. This structure inhibits the functional element 22 from being damaged. The burr 26 is described as an example of a frame body, but the frame body may be a metal layer or an insulating layer. The frame body may be formed by plating. The burr 26 formed when the device chip 21 is cut by the dicing blade 50 as illustrated in FIG. 1B is used as the frame body. This configuration simplifies the fabrication process.

As illustrated in FIG. 11B, the collet 60 (a tool) is caused to hold the device chip 21 by causing the collet 60 to be in contact with the lower surface of the burr 26 without being in contact with the lower surface (the upper surface in FIG. 11B) of the functional element 22. This configuration inhibits the collet 60 from damaging the functional element 22.

The acoustic wave element has been described as an example of the functional element 22, but the functional element 22 may be passive elements other than the acoustic wave element. When a surface acoustic wave element is used as the functional element 22, the burr 26 preferably has a thickness of 2 μm or greater. When a piezoelectric thin film resonator is used as the functional element 22, the burr 26 preferably has a thickness of 6 μm or greater. This configuration makes the burr 26 thicker than the functional element 22.

Figure 12A:
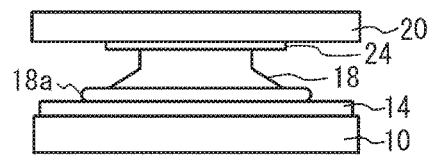
FIG. 12A through FIG. 12D are side views near a bump in a first variation of the first embodiment.
Figure 12B:
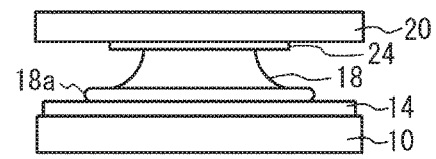
Figure 12C:
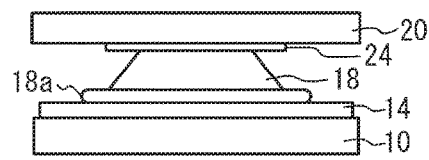
Figure 12D:
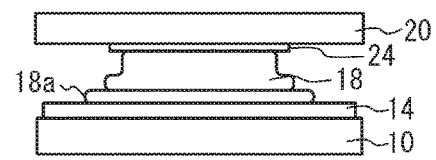

FIG. 12A through FIG. 12D are side views near the bump in a first variation of the first embodiment. As illustrated in FIG. 12A, the side surface of the bump 18 may be two-tiered surface with different taper angles. As illustrated in FIG. 12B, the taper angle of the side surface of the bump 18 may continuously change. As illustrated in FIG. 12C, the taper angle of the side surface of the bump 18 may be constant. As illustrated in FIG. 12D, the cross-section of the bump 18 may have a protruded shape. The shape of the bump can freely selected by using a stud bump as the bump 18.

Figure 13A:
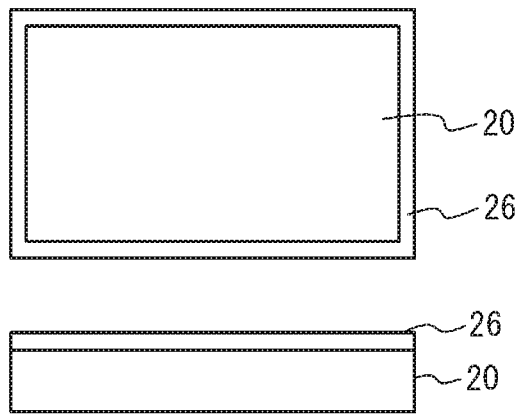
FIG. 13A through FIG. 13C are plan views and side views in a second variation of the first embodiment.
Figure 13B:
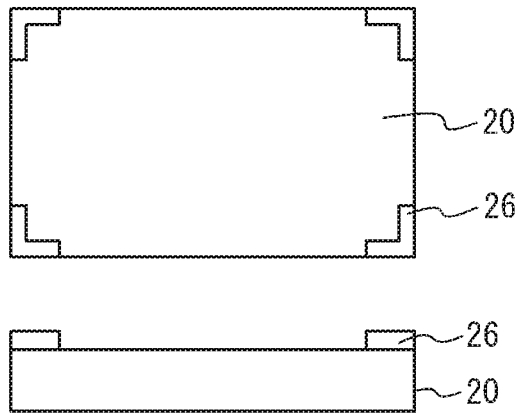
Figure 13C:
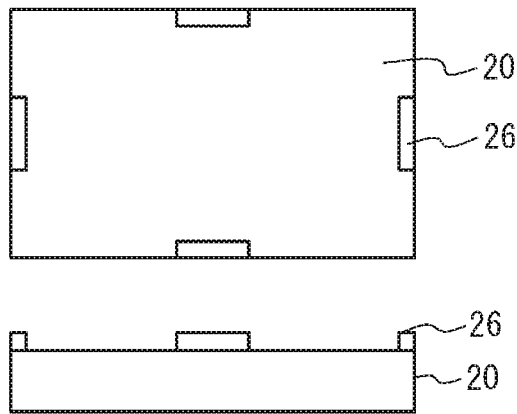

FIG. 13A through FIG. 13C are plan views and side views in a second variation of the first embodiment. In each of FIG. 13A through FIG. 13C, the upper figure is a plan view, and the lower figure is a side view. As illustrated in FIG. 13A, the burr 26 may be located in all the periphery of the substrate 20. As illustrated in FIG. 13B, the burrs 26 may be located at the corners of the substrate 20, and may not be necessarily located in the sides. As illustrated in FIG. 13C, the burrs 26 may be located in the sides of the substrate 20, and may not be necessarily located at the corners. As described above, it is only required that the burr 26 is located at least a part of the periphery of the substrate 20. This structure inhibits the functional element 22 from being damaged. In addition, the sealing material surrounding the substrate 20 is inhibited from penetrating into the air gap 28.

Figure 14A:
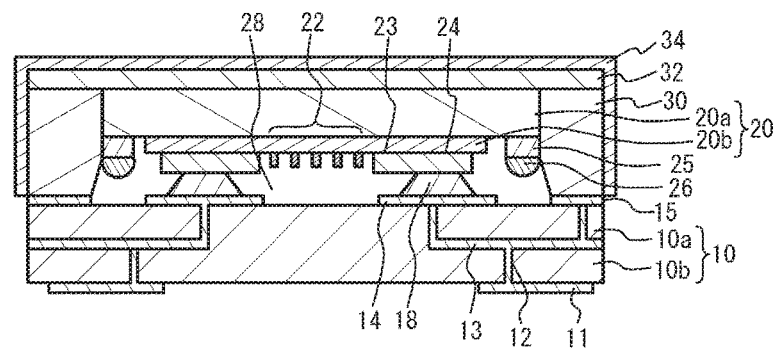
FIG. 14A is a cross-sectional view of a third variation of the first embodiment.
Figure 14B:
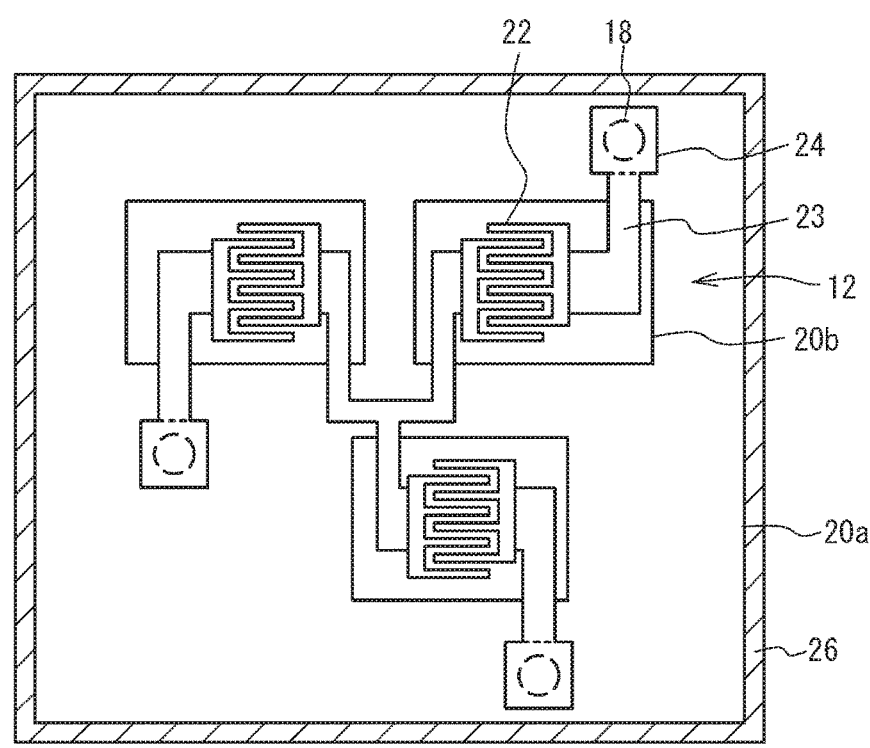
FIG. 14B is a plan view.

FIG. 14A is a cross-sectional view of a third variation of the first embodiment, and FIG. 14B is a plan view. As illustrated in FIG. 14A, the substrate 20 includes a support substrate 20a and a piezoelectric substrates 20b bonded on the lower surface of the support substrate 20a. The functional element 22 is located on the lower surface of the piezoelectric substrate 20b. The burr 26 is located on the lower surface of the support substrate 20a. As illustrated in FIG. 14B, the piezoelectric substrates 20b are dotted on the lower surface of the support substrate 20a like islands. Surface acoustic wave elements as the functional element 22 are located on the lower surfaces of the piezoelectric substrates 20b. The functional element 22 and the pad 24 are coupled by the wiring line 23. The burr 26 is located on the support substrate 20a. As in the third variation of the first embodiment, the burr 26 may be located on the support substrate 20a.

Although the embodiments of the present invention have been described in detail, it is to be understood that the various change, substitutions, and alterations could be made hereto without departing from the spirit and scope of the invention.

What is claimed is:

1. A method of fabricating an electronic device, the method comprising:
   arranging a plurality of device chips on an upper surface of a single mounting substrate, each of the plurality of device chips having a first pad on a lower surface and having no bump on the lower surface, the mounting substrate having bumps on the upper surface of the mounting substrate;
   bonding the first pads on the lower surface of the respective device chips and the bumps on the upper surface of the mounting substrate by applying an ultrasonic wave to the device chips from respective upper surfaces of the device chips; and
   after bonding the first pads and the bumps, separating the mounting substrate having the plurality of device chips mounted thereon into a plurality of substrates each having the corresponding device chip thereon,
   wherein:
   each of the device chips includes, on the lower surface of the device chip, a functional element and a frame body, the frame body surrounding the functional element and having a larger thickness than the functional element, and
   the frame body is configured so as to be not in contact with any of the upper surface of the mounting substrate, the bumps and the second pads on the upper surface of the mounting substrate, after bonding the first pads and the bumps.

2. The method according to claim 1, wherein the first pads and the bumps are made of a same material.

3. The method according to claim 2, wherein each of the bumps is a gold bump.

4. The method according to claim 1, wherein:
   each of the bumps is disposed on a second pad formed on the upper surface of the mounting substrate, and
   an area of a bond between each of the bumps and the corresponding second pad on the upper surface of the mounting substrate is greater than an area of a bond between the bump and the corresponding first pad.

5. The method according to claim 1, wherein the frame body is a burr formed when the device chip is cut by a dicing blade.

6. The method according to claim 1, further comprising:
   causing a tool to hold the device chip by causing the tool to be in contact with a lower surface of the frame body without being in contact with a lower surface of the functional element.

7. The method according to claim 1, wherein the functional element is an acoustic wave element.

8. A method of fabricating an electronic device, the method comprising:
   forming a functional element on an upper surface of a substrate;

forming a metal layer on the upper surface of the substrate so that the metal layer surrounds the functional element;

cutting the substrate into a plurality of device chips by dicing the metal layer and the substrate with use of a dicing blade and thereby forming a burr on an upper surface of the metal layer; and causing a tool to hold at least one of the plurality of device chips by causing the tool to be in contact with an upper surface of the burr without being in contact with an upper surface of the functional element.

9. The method according to claim 8, wherein the functional element is an acoustic wave element.

* * * * *